United States Patent [19]

York et al.

[11] Patent Number: 5,802,090

[45] Date of Patent: Sep. 1, 1998

[54] ROOM TEMPERATURE DIODE LASER EMITTING IN THE 2-5 MICROMETER WAVELENGTH RANGE

[75] Inventors: Pamela Kay York, Yardley, Pa.; Ramon Ubaldo Martinelli, Hightstown, N.J.

[73] Assignee: David Sarnoff Research Center, Inc., Princeton, N.J.

[21] Appl. No.: 854,988

[22] Filed: May 13, 1997

Related U.S. Application Data

[63] Continuation of Ser. No. 545,181, Oct. 19, 1995, abandoned.

[51] Int. Cl.$^6$ ................................................. H01S 3/19
[52] U.S. Cl. ................................................. 372/45; 372/44
[58] Field of Search ........................ 372/45, 41, 43, 372/44, 46, 50, 69, 75; 257/190, 97, 103, 13, 201, 184; 102/336

[56] References Cited

U.S. PATENT DOCUMENTS

| | | | |
|---|---|---|---|
| 4,934,273 | 6/1990 | Endriz | 102/336 |
| 5,251,225 | 10/1993 | Eglash et al. | 372/45 |
| 5,315,608 | 5/1994 | Choi et al. | 372/41 |
| 5,479,032 | 12/1995 | Forrest et al. | 257/190 |
| 5,577,061 | 11/1996 | Hasenberg et al. | 372/45 |

OTHER PUBLICATIONS

Hecht, Jeff. Understanding Lasers: An Entry-Level Guide. New York: Institute of Electrical Electronics Engineers, Inc. 1994, 2nd edition, pp. 281–284, especially p. 281.

Copy of Written Opinion dated 01 Aug. 1997 from corresponding international application PCT/US96/16310.

"3.06μm InGaAsSb/InPSb Diode Lasers Grown By Organometallic Vapor–Phase Epitaxy" R. M. Menna, et al. App. Phys. Lett. 59(17) 21 Oct. 1991 pp. 2127–2129.

"2.7-μm InGaAsSb/AlGaAsSb Laser Diodes With Continuous-Wave Operation Up To −39°C" D. Z. Garbuzov, et al Applied Physics Letter vol. 67 4 Sep. 1995 No. 10 pp. 1346–1348.

"Laser Diodes And Applications" R. Martinelli, et all SPIE vol. 2382 8–10 Feb. 1995 pp. 250–261.

Primary Examiner—Rodney B. Bovernick
Assistant Examiner—Luong-Quyen T. Phan
Attorney, Agent, or Firm—William J. Burke

[57] ABSTRACT

A semiconductor laser diode which emits radiation in the 2–5 micrometer wavelength range and operates at room temperature. The laser diode includes an active layer of an $In_xGa_{1-x}As_ySb_{1-y}$ alloy and a separate cladding layer on each side of the active layer. One of the cladding layers is of n-type conductivity and the other cladding layer is of p-type conductivity. At least the n-type cladding layer, and preferably both cladding layers, are of either an InAlPSb or an InGaPSb alloy.

9 Claims, 1 Drawing Sheet

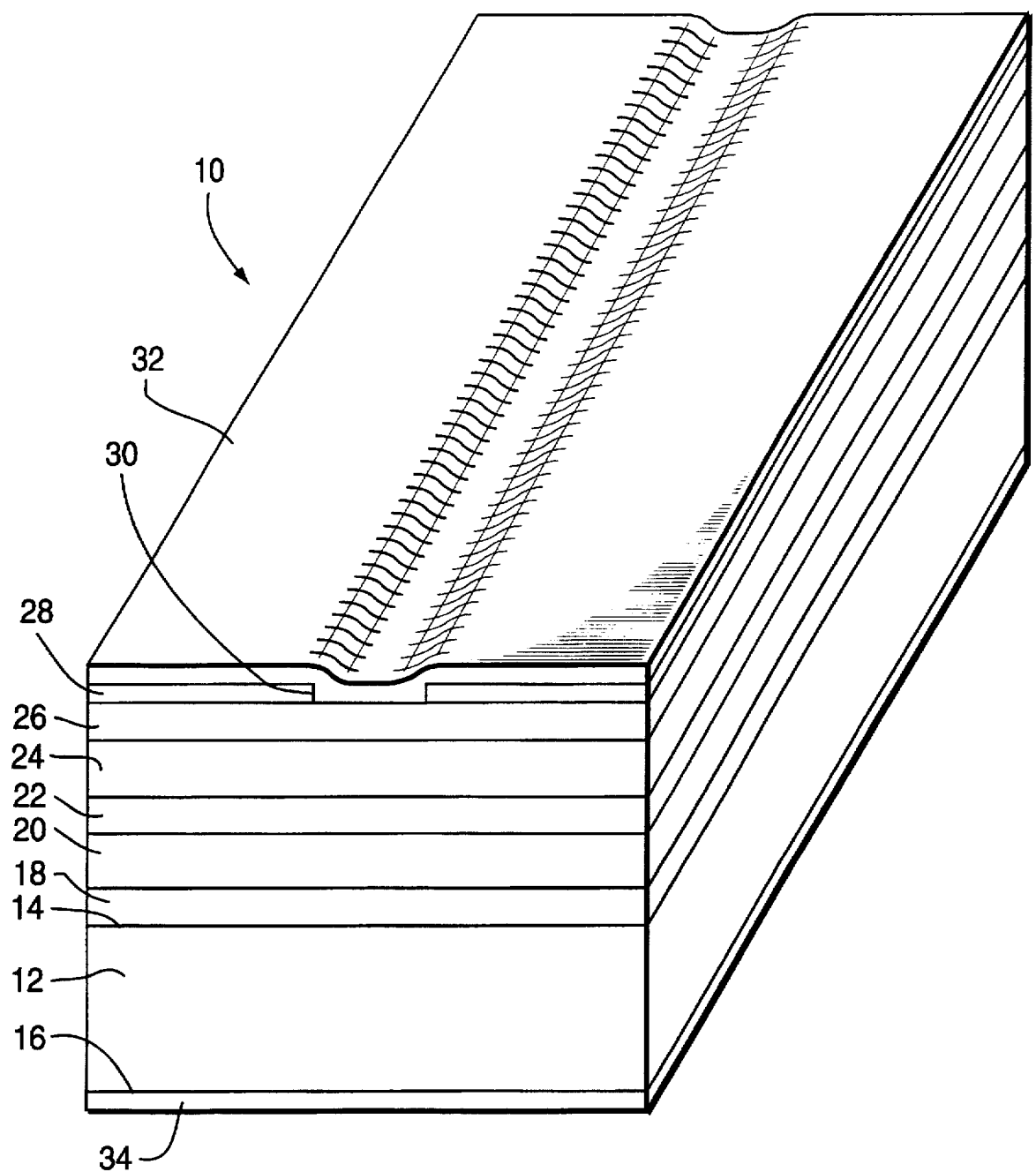

ROOM TEMPERATURE DIODE LASER EMITTING IN THE 2-5 MICROMETER WAVELENGTH RANGE

This application is a continuation of application Ser. No. 08/545,181 filed on Oct. 19, 1995 now abandoned.

This invention was made with Government support under Contract No. F29601-93-C-0036 awarded by the U.S. Department of the Air Force. The Government has certain rights in this invention.

The invention is directed to a semiconductor diode laser which emits radiation in the 2-5 micrometer wavelength range, and, more particularly, to such a diode laser which operates at room temperature.

BACKGROUND OF THE INVENTION

It would be desirable to have a diode laser which emits radiation in the 2-5 micrometer wavelength range. Diode lasers generally include an active region and either a cladding or confinement region on each side of the active region. The purpose of the cladding or confinement regions is to confine carriers and light to the active region. Heretofore, such confinement has not been achieved with semiconductor materials which will emit radiation in the 2-5 micrometer wavelength range. Although lasers from lead-salts, solid materials or gases have been developed which emit in the 2-5 micrometer wavelength range, these devices do not operate at room temperature. Therefore, these lasers require cooling means which greatly increase the size and cost of the lasers. Therefore, it would be desirable to have a semiconductor diode laser which emits radiation in the 2-5 micrometer wavelength range and which operates at room temperature.

SUMMARY OF THE INVENTION

The invention is directed to a semiconductor diode laser which includes an active layer comprising an $In_xGa_{1-x}As_ySb_{1-y}$ alloy and a cladding layer on each side of the active layer. At least one of the cladding layers comprises an InAlPSb or an InGaPSb alloy.

BRIEF DESCRIPTION OF THE DRAWING

The sole FIGURE is a perspective view of one form of a diode laser made in accordance with the invention.

DETAILED DESCRIPTION

In the sole FIGURE, a semiconductor diode laser, generally designated as 10, comprises a substrate 12 of a semiconductor material of n-type conductivity having a pair of opposed surfaces 14 and 16. On the surface 14 of the substrate 12 is a buffer layer 18 of the same semiconductor material as that of the substrate 12 and of the same conductivity type. The purpose of the buffer layer 18 is to provide a substantially defect free surface on which to form the remaining layers of the diode laser 10. However, if the substrate surface 14 is sufficiently defect free, the buffer layer 18 can be eliminated.

On the buffer layer 18 is a first cladding layer 20 of a semiconductor material of the same type conductivity as the substrate. An active layer 22 of a semiconductor material is on the first cladding layer 20. The active layer 22 may be of any form well known in the art and is typically 0.5 micrometers or less in thickness. For example, the active layer may be a quantum well layer, a multiple quantum well structure or a large optical cavity (LOC) structure. For a quantum well structure, the active layer 22 is undoped and is typically comprised of a plurality of layers about 10 nanometers or less in thickness. On the active layer 22 is a second cladding layer 24 of a semiconductor material of the opposite type conductivity as the substrate. On the second cladding layer 24 is a cap layer 26 of a semiconductor material of the opposite type conductivity as the substrate and is highly conductive.

A layer 28 of an insulating material, such as silicon dioxide, is over the cap layer 26. The insulating material layer 28 has an opening 30 therethrough to the cap layer 26. A first conductive metal contact layer 32 is over the insulating material layer 28 and extends into the opening 30 to contact the cap layer 26. A second conductive metal contact layer 34 is over the surface 16 of the substrate 12.

To provide a diode laser 10 which emits radiation in the 2-5 micrometer wavelength range, the active layer 22 is of an alloy such as $In_xGa_{1-x}As_ySb_{1-y}$. Other alloys of In, Ga, Al, As, P and Sb may be used. In order to confine holes to the active layer, at least the n-type cladding layer, which is layer 20 for an n-type substrate of either $In_aAl_{1-a}P_bSb_{1-b}$ or $In_aGa_{1-a}P_bSb_{1-b}$. Preferably both of the cladding layers 20 and 24 are of the same material and are about 2-3 micrometers in thickness. Preferably the fractional aluminum content of the InAlPAs cladding layers 20 and 24 is greater than 0.2 while maintaining close lattice match to the substrate. Close lattice match typically means within 0.1%. The substrate 12 and the buffer layer 18 are of a material which has a close lattice match to the material of the first cladding layer 20. Either GaSb or InAs can have such a lattice match. For example, $In_{0.50}Al_{0.50}P_{0.33}Sb_{0.67}$ has a close lattice match to GaSb. The cap layer 26 may also be of either GaSb or InAs. Thus, the diode laser 10 includes a substrate 10 and buffer layer 18 of either GaSb or InAs, first and second cladding layers 20 and 24 of either InAlPSb or InGaPSb, and active layer 22 such as $In_xGa_{1-x}As_ySb_{1-y}$ and a cap layer 26 of either GaSb or InAs.

Room temperature operation of a semiconductor laser diode in this context means operation at a temperature greater than 250° K.

Thus there is provided by the invention a semiconductor laser diode 10 having an active layer 22 of InGaAsSb which emits radiation in the 2-5 micrometer wavelength range, and cladding layers 20 and 24 on each side of the active layer 22 of either InAlPSb or InGaPSb which confines electrons and holes into the active layer 22. In addition, the laser diode 10 operates at room temperature so as to be small and relatively inexpensive. It is to be understood that the devices described herein are illustrative of the invention. Modifications may readily be devised by those skilled in the art without departing from the spirit or scope of the invention.

What is claimed is:

1. A semiconductor diode laser which emits radiation in the 2-5 micron wavelength regime comprising:

an active layer of InGaAsSb; and a cladding layer on each side of the active layer with one of the cladding layers being of n-type conductivity and the other cladding layer being of p-type conductivity and with at least the n-type conductivity cladding layer being of either InAlPSb or InGaPSb.

2. The diode laser of claim 1 in which both of the cladding layers are of either InAlPSb or InGaPSb.

3. A semiconductor laser diode which emits radiation in the 2-5 micron wavelength regime comprising:

a substrate of a semiconductor material of n-type conductivity having first and second opposed surfaces;

a first cladding layer of n-type conductivity on the first surface of the substrate, the first cladding layer being of either InAlPSb or InGaPSb;

an active layer of InGaAsSb on the first cladding layer; and a second cladding layer of p-type conductivity on the active layer.

4. The semiconductor laser diode of claim 3 in which the second cladding layer is of either an InAlPSb or an InGaPSb alloy.

5. The semiconductor laser diode of claim 4 in which the substrate is of either GaSb or InAs.

6. The semiconductor laser diode of claim 5 further comprising a cap layer of highly conductive p-type conductivity on the second cladding layer.

7. The semiconductor laser diode of claim 6 in which the cap layer is of either GaSb or InAs.

8. The semiconductor laser diode of claim 7 further comprising a first conductive metal contact layer on the cap layer and a second conductive metal contact layer on the second surface of the substrate.

9. The semiconductor laser diode of claim 8 further comprising a buffer layer of the same semiconductor material as the substrate between the first surface of the substrate and the first cladding layer.

* * * * *